United States Patent
Chen et al.

(10) Patent No.: US 10,395,903 B2
(45) Date of Patent: Aug. 27, 2019

(54) SELF-SUSTAINED NON-AMBIPOLAR DIRECT CURRENT (DC) PLASMA AT LOW POWER

(71) Applicants: Zhiying Chen, Austin, TX (US); Lee Chen, Cedar Creek, TX (US); Merritt Funk, Austin, TX (US)

(72) Inventors: Zhiying Chen, Austin, TX (US); Lee Chen, Cedar Creek, TX (US); Merritt Funk, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/983,532

(22) Filed: May 18, 2018

(65) Prior Publication Data
US 2018/0269041 A1 Sep. 20, 2018

Related U.S. Application Data

(63) Continuation of application No. 14/168,565, filed on Jan. 30, 2014, now Pat. No. 9,978,568.
(Continued)

(51) Int. Cl.
H01J 37/32 (2006.01)
C23C 16/50 (2006.01)
H01J 37/30 (2006.01)

(52) U.S. Cl.
CPC ........ *H01J 37/32899* (2013.01); *H01J 37/30* (2013.01); *H01J 37/3233* (2013.01); *H01J 37/32082* (2013.01)

(58) Field of Classification Search
None
See application file for complete search history.

(56) References Cited

U.S. PATENT DOCUMENTS 4,786,844 A 11/1988 Farrell et al.
4,867,859 A 9/1989 Harada et al.
(Continued)

FOREIGN PATENT DOCUMENTS

JP 7221068 8/1995

OTHER PUBLICATIONS

Chinese Patent Office; Office Action in related Chinese Patent Application No. 200980110185.9 dated Apr. 5, 2012; 12 pages.
(Continued)

*Primary Examiner* — Shamim Ahmed
(74) *Attorney, Agent, or Firm* — Wood Herron & Evans LLP

(57) ABSTRACT

A processing system is disclosed, having an electron beam source chamber that excites plasma to generate an electron beam, and an ion beam source chamber that houses a substrate and also excites plasma to generate an ion beam. The processing system also includes a dielectric injector coupling the electron beam source chamber to the ion beam source chamber that simultaneously injects the electron beam and the ion beam and propels the electron beam and the ion beam in opposite directions. The voltage potential gradient between the electron beam source chamber and the ion beam source chamber generates an energy field that is sufficient to maintain the electron beam and ion beam as a plasma treats the substrate so that radio frequency (RF) power initially applied to the processing system to generate the electron beam can be terminated thus improving the power efficiency of the processing system.

20 Claims, 4 Drawing Sheets

Related U.S. Application Data

(60) Provisional application No. 61/864,965, filed on Aug. 12, 2013.

(56) References Cited

U.S. PATENT DOCUMENTS

| | | | |
|---|---|---|---|
| 5,350,480 | A | 9/1994 | Gray |
| 5,468,955 | A | 11/1995 | Chen et al. |
| 5,601,653 | A | 2/1997 | Ito |
| 5,976,259 | A | 11/1999 | Yamazaki |
| 6,352,049 | B1 | 3/2002 | Yin et al. |
| H002212 | H | 4/2008 | Walton et al. |
| 7,732,759 | B2 | 6/2010 | Chen et al. |
| 9,978,568 | B2 | 5/2018 | Chen et al. |
| 2002/0005252 | A1 | 1/2002 | Masuda et al. |
| 2003/0052087 | A1 | 3/2003 | Kwon et al. |
| 2004/0036032 | A1 | 2/2004 | Leung et al. |
| 2004/0082187 | A1 | 4/2004 | Chistyakov |
| 2004/0244687 | A1 | 12/2004 | Ichiki et al. |
| 2006/0066247 | A1 | 3/2006 | Koshiishi et al. |
| 2007/0069118 | A1 | 3/2007 | Economou et al. |
| 2008/0026488 | A1 | 1/2008 | Panda et al. |
| 2009/0236314 | A1 | 9/2009 | Chen |
| 2010/0320395 | A1 | 12/2010 | Hahto et al. |
| 2011/0177694 | A1 | 7/2011 | Chen et al. |
| 2011/0226422 | A1* | 9/2011 | Kwan .................. H01J 27/16 156/345.48 |
| 2014/0273538 | A1* | 9/2014 | Chen .................. H01L 21/263 438/798 |

OTHER PUBLICATIONS

Japanese Patent Office; Office Action in related Japanese Patent Application No. JP 2011-500969 dated Feb. 26, 2013; 7 pages.

Chinese Patent Office; Office Action in related Chinese Patent Application No. 200980110185.9 dated Aug. 20, 2013; 19 pages.

Taiwanese Patent Office; Office Action in related Taiwanese Patent Application No. 98109152 dated Jul. 16, 2013; 25 pages.

Japanese Patent Office; Office Action in related Japanese Patent Application No. 2011-500969 dated Sep. 24, 2013; 5 pages.

Chinese Patent Office; Office Action in related Chinese Patent Application No. 200980110185.9 dated Mar. 5, 2013; 17 pages.

Chinese Patent Office; Office Action in related Chinese Patent Application No. 200980110185.9 dated Mar. 24, 2014; 10 pages.

U.S. Patent and Trademark Office; Office Action in related U.S. Appl. No. 12/053,008 dated Aug. 3, 2011; 16 pages.

U.S. Patent and Trademark Office; Office Action in related U.S. Appl. No. 12/053,008 dated Jan. 5, 2012; 17 pages.

U.S. Patent and Trademark Office; Search Report and Written Opinion in related International Patent Application No. PCT/US2014/043342 dated Oct. 22, 2014; 8 pages.

International Bureau of WIPO; International Preliminary Report on Patentability in related International Patent Application No. PCT/US2014/043342 dated Feb. 25, 2016; 7 pages.

Chen et al; Publication entitled "Direct Current-Self-Sustained Non-Ambipolar Plasma at Low Pressure", Applied Physics Letters, vol. 103, Issue 25 published Dec. 20, 2013, 4 pages.

* cited by examiner

SELF-SUSTAINED NON-AMBIPOLAR DIRECT CURRENT (DC) PLASMA AT LOW POWER

CROSS REFERENCE TO RELATED APPLICATION

This application is a Continuation of U.S. application Ser. No. 14/168,565, filed Jan. 30, 2014, and that Application claims the benefit of and priority to prior filed Provisional Application Ser. No. 61/864,965 filed Aug. 12, 2013, the entire disclosure of those Applications being incorporated by reference herein in their entireties.

FIELD OF THE INVENTION

This invention relates to semiconductor processing technology, and more particularly, to apparatus and methods for controlling properties of a processing system for treating a substrate.

BACKGROUND OF THE INVENTION

Typically, high-energy ions generated in conventional etch processes that use plasma, such as reactive ion etching (RIE), are difficult to control within the plasma. Conventional RIE techniques are associated with several issues that hinder the overall performance in etching the substrate due to the lack of control of the high-energy ions. Conventional RIE techniques often have broad ion energy distribution (TED). A broad ion energy distribution decreases the precision required to adequately etch the substrate. Conventional RIE techniques also have charge-induced side effects such as charge damage to the substrate, and feature-shape loading effects such as micro loading. Micro loading results in an increase in etching rate due to a dense area of the substrate. The increased etching rate may result in non-uniform etching of the substrate.

It is becoming common wisdom to use conventional electron beam excited plasma to process substrates. Conventional electron beam excited plasma processes operate with direct current so that the electron beam density and energy are controlled independently by discharge current and accelerating voltage, respectively, due to the constant-voltage and constant-current characteristics. Therefore, the electron temperature and plasma density, as well as sheath potential, are easily controlled at the substrate as compared to other conventional plasma processes.

Conventional electron beam excited plasma processes implement a two chamber approach. An electron beam source chamber is used to generate the electron beam by exciting plasma within the electron beam source chamber. Hot filament discharge, hollow cathode discharge and inductively couple discharge (RF power) have been applied to the electron beam source chamber to excite plasma in the electron beam source chamber. The excited electrons in the electron beam source chamber travel through one or more differentially biased grids into the process chamber to generate plasma in the process chamber. A magnetic field is also applied to the process chamber to confine or enlarge the electron beam in the radial direction.

The electron beam excited plasma continues to process the substrate as long as the power supplied to the electron beam source chamber to excite the electrons is maintained. Thus, the power is continuously supplied to the electron beam source chamber during treatment of the substrate. The continuous supply of power to the electron beam source chamber has a significant impact on the power efficiency in treating the substrate. Therefore, an effective means to decrease the overall power used to maintain the strength of the electron beam while processing the substrate is needed.

SUMMARY OF THE INVENTION

The present invention provides a processing system for self-sustained non-ambipolar plasma treatment of a substrate, including an electron beam source chamber and an ion beam source chamber. The electron beam source chamber is configured to excite electron beam source plasma and supply electrons for the ion beam source chamber to excite plasma (electron beam excited plasma) in the ion beam source chamber. The ion beam source chamber is configured to excite electron beam excited plasma and supply ions to the electron beam source chamber to excite plasma (electron beam source plasma) in the electron beam source chamber. The electron beam source plasma excited by the ions supplied to the electron beam source chamber is then sustained by the supplied ions and becomes an ion beam excited plasma. One or both of electron beam source chamber and the ion beam source chamber is configured to house the substrate to be treated by one or both of the electron beam source plasma and the electron beam excited plasma. The processing system also includes a dielectric injector coupling the electron beam source chamber to the ion beam source chamber and configured to inject high-energy electrons from the electron beam source chamber into the ion beam source chamber. The dielectric injector is also configured to inject high-energy ions from the ion beam source chamber into the electron beam source chamber. An energy field is generated from a voltage potential gradient applied between the electron beam source chamber and ion beam source chamber to maintain the electron beam source plasma and the electron beam excited plasma.

The present invention also provides a method for maintaining an electron beam source plasma and electron beam excited plasma to treat a substrate housed in an electron beam source chamber and/or an ion beam source chamber based on an energy field generated by a voltage potential gradient applied between the electron beam source chamber and the ion beam source chamber to minimize power consumed by a processing system that processes the substrate. The method starts with exciting plasma in an electron beam source chamber and generating the electron beam from the electron beam source chamber. The method further includes generating an energy field from a voltage potential gradient generated between the electron beam source chamber and an ion beam source chamber. The method further includes injecting the electron beam from the electron beam source chamber and propelling the electron beam to the ion beam source chamber through a dielectric injector coupling the electron beam source chamber to the ion beam source chamber. The method further includes exciting an electron beam excited plasma in the ion beam source chamber and generating the ion beam from the electron beam excited plasma. The method further includes providing a substrate in one or both of the electron beam source chamber and the ion beam source chamber. The method further includes injecting the ion beam from the electron beam excited plasma and propelling the ion beam through the dielectric injector and into the electron beam source chamber. The electron beam source plasma excited by the ion beam is then sustained by the ion beam and becomes an ion beam excited plasma. The propelling of the electron beam and the ion beam is affected by the voltage potential gradient applied between the electron beam source chamber and the ion beam source chamber. The method further includes maintaining the electron beam source plasma and electron beam excited plasma as one or both treat the substrate.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

Figure 1:
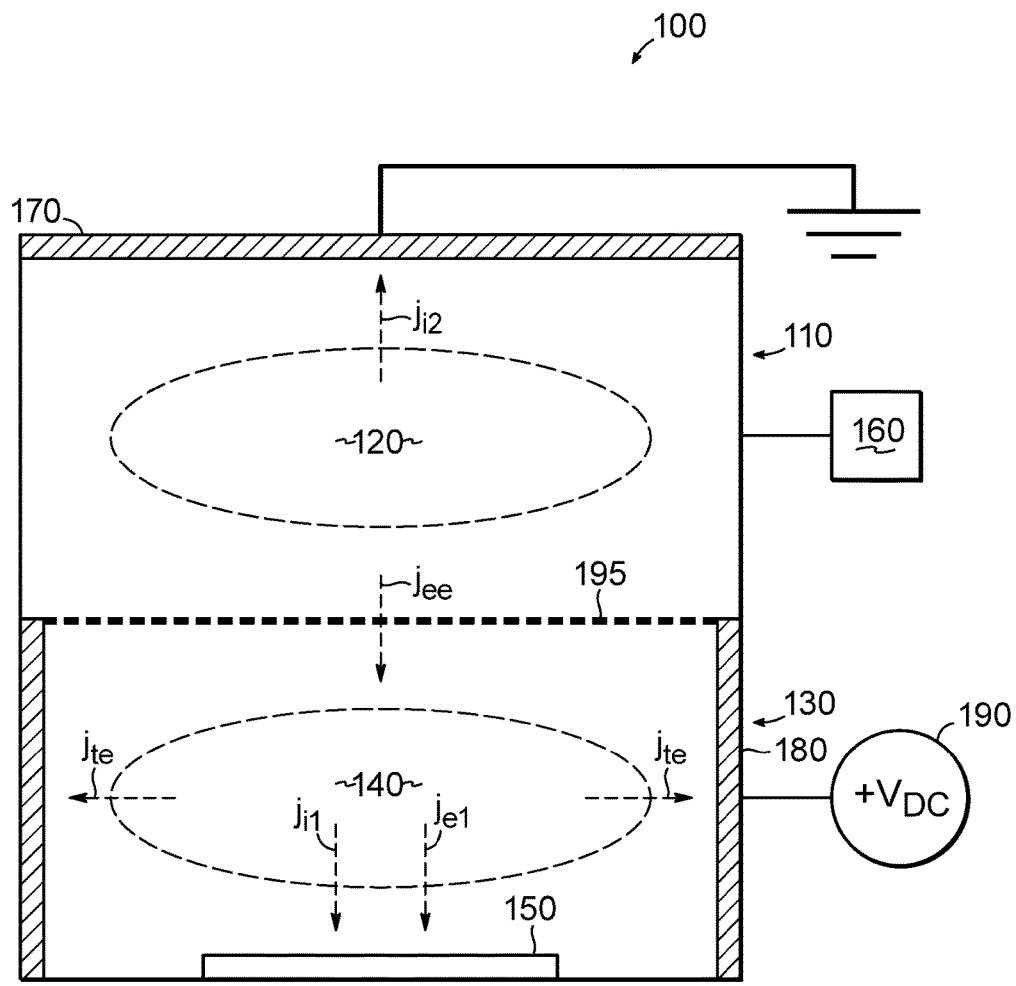
FIG. 1 is a schematic cross-sectional illustration of an exemplary processing system for neutral beam treatment of a substrate in accordance with an embodiment of the disclosure.

FIG. 1 depicts a conventional processing system 100 for neutral beam treatment of a substrate. The conventional processing system 100 includes a plasma generation chamber 110 that forms a source plasma 120 at a source plasma potential ($V_p$, 1) and a process chamber 130 that forms an electron beam excited plasma 140 at an electron beam excited plasma potential ($V_p$, 2). The electron beam excited plasma potential is greater than the source plasma potential ($V_p$, 2>$V_p$, 1).

A coupling power, such as radio frequency (RF) power, may be applied to the source plasma 120 to form an ionized gas. The electron beam excited plasma 140 may be formed using electron flux generated by the source plasma 120. The electron flux may include but is not limited to energetic electron (ee) flux, current ($j_{ee}$) flux and/or any other type of flux generated by the source plasma 120 that may be used to form the electron beam excited plasma 140 that will be apparent to those skilled in the relevant art(s) without departing from the scope of the present disclosure. The conventional processing system 100 also includes a substrate holder (not shown) that may position a substrate 150. The substrate 150 may be positioned at a direct current (DC) ground or a floating ground in the process chamber 130 so that the substrate 150 may be exposed to the electron beam excited plasma 140 at the electron beam excited plasma potential ($V_p$, 2).

The plasma generation chamber 110 may be coupled to a plasma generation system 160. The plasma generation system 160 may ignite and heat the source plasma 120. The plasma generation system 160 may heat the source plasma 120 so that a minimum fluctuation in the source plasma potential is achieved. The plasma generation system 160 may include but is not limited to an inductively coupled plasma (ICP) source, a transformer coupled plasma (TCP) source, a capacitively coupled plasma (CCP) source, an electron cyclotron resonance (ECR) source, a helicon wave source, a surface wave plasma source, a surface wave plasma source having a slotted plane antenna, and/or any other plasma generating system that may heat the source plasma 120 with minimum fluctuation in the source plasma potential that will be apparent to those skilled in the relevant art(s) without departing from the scope of the present disclosure.

The plasma generation chamber 110 is also coupled to a direct current (DC) conductive electrode 170. The DC conductive electrode 170 includes a conductive surface that may be in contact with the source plasma 120. The DC conductive electrode 170 may be coupled to DC ground, and may act as an ion sink that may be driven by the source plasma 120 at the source plasma potential. The plasma generation chamber 110 may be coupled to any quantity of DC conductive electrodes 170 coupled to DC ground that will be apparent to those skilled in the relevant art(s) without departing from the scope of the present disclosure.

The DC conductive electrode 170 may affect the source plasma potential, and may provide the lowest impedance path to DC ground. The source plasma potential may be lowered when the surface area of the conductive surface of the DC conductive electrode 170 in contact with the source plasma 120 is greater than the surface areas of other surfaces also in contact with the source plasma 120. The greater the surface area of the conductive surface in contact with the source plasma 120 relative to the surface areas of other surfaces also in contact with the source plasma 120 provides a greater discrepancy in the impedance of the conductive surface relative to the impedances of the other surfaces, and this greater discrepancy provides a lower impedance path to DC ground for the source plasma 120 and thus lowers the source plasma potential.

The electron current $j_{ee}$ may be electron flux from the source plasma 120 that may initiate and/or sustain the electron beam excited plasma 140 in the process chamber 130. The electron current $j_{ee}$ may be controlled to produce a neutral beam. The neutral beam includes electrons included in the source plasma 120 that are excited by the RF power applied to the source plasma 120 and also a first population of ions also included in the source plasma 120. The quantity of the first population of ions is equal to the excited electrons. In order to generate the neutral beam, the source plasma potential and the electron beam excited plasma potential are stabilized with minimal fluctuations between each. To maintain the stability of the electron beam excited plasma 140, the process chamber 130 includes a DC conductive bias electrode 180 having a conductive surface in contact with the electron beam excited plasma 140.

The DC conductive bias electrode 180 may be coupled to a DC voltage source 190. The DC voltage source 190 may bias the DC conductive bias electrode 180 at a positive DC voltage (+$V_{DC}$). As a result, the electron beam excited plasma potential may be a boundary-driven plasma potential driven by the positive DC voltage source, thus causing the electron beam excited plasma potential ($V_p$, 2) to rise substantially to the positive DC voltage (+$V_{DC}$) and remain substantially stable at the positive DC voltage (+$V_{DC}$). The process chamber 130 may be coupled to any quantity of DC conductive bias electrodes 180 coupled to the DC voltage source 190 that will be apparent to those skilled in the relevant art(s) without departing from the scope of the present disclosure.

The conventional processing system 100 also includes a separation member 195 disposed between the plasma generation chamber 110 and the process chamber 130. The separation member 195 may act as an electron diffuser. The separation member 195 may be driven by an electric field through an electron acceleration layer created by a voltage potential difference of ($V_p$, 2)–($V_p$, 1). The separation member 195 may include an insulator, quartz, alumina, a dielectric coated conductive material that is electrically floating with high RF impedance to ground, and/or any other separation member 195 that will be apparent to those skilled in the relevant art(s) without departing from the scope of the present disclosure. Due to the large electric field sustained across the separation member 195 of ($V_p$, 2)–($V_p$, 1), the electron current $j_{ee}$ is sufficiently energetic to sustain ionization in the electron beam excited plasma 140.

The separation member 195 may include one or more openings to permit the passage of electron current $j_{ee}$ from the plasma generation chamber 110 to the process chamber 130. The total area of the one or more openings may be adjusted relative to the surface area of the DC conductive electrode 170 to ensure a relatively large potential difference of ($V_p$, 2)–($V_p$, 1) while minimizing reverse ion current from the electron beam excited plasma 140 to the source plasma 120 thereby ensuring a sufficient ion energy for the ions included ion current $j_{i1}$ that strike the substrate 150.

Ion current $j_{i2}$ may be a second ion flux from a second population of ions in the source plasma 120 that flows in the plasma generation chamber 110 to the DC conductive electrode 170 in a quantity approximately equivalent to the first population of ions included in the electron current $j_{ee}$. The electron current $j_{ee}$ may flow from the source plasma 120 through the electron acceleration layer (not shown) at the separation member 195 into the electron beam excited plasma 140. The electron current $j_{ee}$ may be sufficiently energetic to form the electron beam excited plasma 140. In doing so, a population of thermal electrons is formed. The thermal electrons may be the result of electrons ejected upon ionization of the electron beam excited plasma 140 by the incoming electron current $j_{ee}$. Some energetic electrons from the electron current $j_{ee}$ may lose a sufficient amount of energy and also become part of the thermal electron population. Due to Debye shielding, the thermal electrons of the electron beam excited plasma 140 may flow to the DC conductive bias electrode 180 as the thermal electron current $j_{te}$ in a quantity equal to the energetic electron flux of $j_{te}$-$j_{ee}$.

The first population of ions originally included in the source plasma 120 may be directed towards the substrate 150 due to the electron current $j_{ee}$ to treat the substrate 150. With the thermal electrons directed to the DC conductive bias electrode 180, a first ion flux from the first population of ions in ion current $j_{i1}$ may be directed to the substrate 150 at the second voltage potential. A substantial amount of ion current $j_{i1}$ may survive passage through the electron beam excited plasma 140 and strike the substrate 150 when the incoming energetic electron energy in electron current $j_{ee}$ is high. Because the substrate 150 may be at a floating DC ground, the ion current $j_{i1}$ that may be fed by the first ion population in the electron beam excited plasma 140 and may be equivalent to the electron current $j_{e1}$ so that there is no net current.

As a result, the elevation of the electron beam excited plasma potential above the source plasma potential may drive an energetic electron beam having electron current $j_{ee}$ to form the electron beam excited plasma 140. The particle balance throughout the conventional processing system 100 may provide the energetic electron beam with an equal number of electrons with electron current $j_{e1}$ and ions with ion current $j_{i1}$ striking the substrate 150 so that the energetic electron beam is a neutral beam where the electron current $j_{e1}$ is equal to the ion current $j_{i1}$. The ions included in the ion current $j_{i1}$ treat the substrate 150 while the electrons included in the electron current $j_{e1}$ control the IED of the ion current $j_{i1}$ and minimize the quantity of positively charged ions included in the ion current $j_{i1}$ that may lose their positive charge and thus weaken the ion current $j_{i1}$. The charge balance of the neutral beam directed at the substrate 150 activates a chemical process at the substrate 150.

The neutral beam treatment of substrate 150 discussed above in FIG. 1 requires a significant amount of power to be continuously applied to the conventional processing system 100 to maintain the electron current $j_{ee}$ at a sufficient system power level so that the resulting ion current $j_{i1}$ can treat the substrate 150. For more efficient power usage during neutral beam treatment of a substrate, the present invention provides a self-sustained non-ambipolar plasma system. The non-ambiploar plasma system generates a neutral beam in that low-energy positively charged ions included in the neutral beam are balanced by high-energy negatively charged electrons.

The electron beam is generated in an electron beam source chamber that includes electron beam source plasma. The electron beam source plasma includes an equal number of positively charged ions and negatively charged electrons. The electron beam source plasma may be excited by an electric-magnet field generated by RF power that generates electron flux in a similar fashion as the electron flux $j_{ee}$ discussed in FIG. 1. A portion of the negatively charged electrons that are included in the electron beam plasma may have a sufficient amount of energy to be excited by the electric-magnet field provided by the RF power forming the electron current similar to the electron current $j_{e1}$ discussed in FIG. 1. The excited high-energy electrons and an equal number of low energy ions already present in the electron beam source plasma similar to the ion current $j_{i1}$ discussed in FIG. 1 then pass from the electron beam source plasma located in the electron beam source chamber into an ion beam source chamber. The ion beam source chamber houses the substrate that is to be treated and also the electron beam excited plasma that is ignited by the high-energy electron beam. The high-energy electrons pass from the electron beam source chamber into the ion beam source chamber to form the electron beam.

The travelling of the electron beam from the electron beam source chamber to the ion beam source chamber occurs based on a difference in electric potential between the electron beam source plasma and the electron beam excited plasma. The electric potential of the electron beam excited plasma is elevated relative to the electric potential of the electron beam source beam plasma. Consequently, the electron beam moves from the electron beam source chamber to the ion beam source chamber to generate plasma to treat the substrate.

The ionization efficiency of the electron beam excited plasma increases in the non-ambipolar plasma system as compared to conventional electron beam excited processes. The electron beam source chamber and the ion beam source chamber in the non-ambipolar plasma system are separated by a dielectric injector. As the electron beam source plasma housed in the electron beam source chamber is excited forming the electron beam, the high-energy electrons included in the electron beam source plasma housed in the electron beam source chamber flow through the dielectric injector into the ion beam source chamber. The dielectric injector injects the high-energy electrons into the ion beam source chamber. The injection of the negatively charged electrons into the ion beam source chamber maintains the ionization as the electron beam flows through the ion beam source chamber towards the substrate, thus improving the ionization efficiency of the electron beam excited plasma.

As noted above, the high-energy electrons included in the electron beam ignite the electron beam excited plasma housed in the ion beam source chamber. The electron beam ignited plasma includes an equal number of negatively charged electrons and positively charged ions. The negatively charged electrons include high-energy electrons that are included in the electron beam and also low-energy electrons already present in the electron beam ignited plasma. The positively charged ions include the low-energy ions that are included in the electron beam excited plasma and also ions that have the potential to be excited into high-energy ions already present in the electron beam excited plasma.

The ion beam source chamber in the non-ambipolar plasma system includes a positively charged accelerator that generates direct current (DC) voltage to generate a significant difference in electric potential between the electron beam source chamber and the ion beam source chamber. A portion of the positively charged ions included in the electron beam excited plasma may be excited by the difference in electric potential to have high energy levels and accelerated from the ion beam source chamber through the dielectric injector into the electron beam source chamber. The energy and the current of the high-energy ions injected into the electron beam source chamber maintains the strength of the electron beam excited plasma that treats the substrate located in the ion beam source chamber so that the RF power supplied to the electron beam source chamber may be terminated. Thus, the non-ambipolar plasma system is self-sustained.

Conventional electron beam excited processes continuously supply RF power to the electron beam source chamber to maintain the strength of the electron beam until the processing of the substrate is completed. The continued supply of RF power to the electron beam source chamber results in a high system power level for a conventional system and is a significant use of power that has a significant impact on the power efficiency of processing the substrate while having an impact on the cost of processing the substrate. Thus, the power efficiency of processing the substrate with the continuous drain on RF power as used in conventional electron beam excited processes is significantly worse than the ion beam implemented by the non-ambipolar plasma system.

As the following description will show in detail, the disclosed invention takes advantage of self-sustainment to significantly decrease the amount of power used to maintain the strength of the electron beam during the processing of the substrate. This serves to improve the power efficiency of treating the substrate via the electron beam while minimizing cost applied to processing the substrate. In the description that follows, even though references may be made to non-ambipolar plasma, it should be understood that the system and method apply to a variety of desired electron beams (electron beams of chosen charge characteristics).

Figure 2:
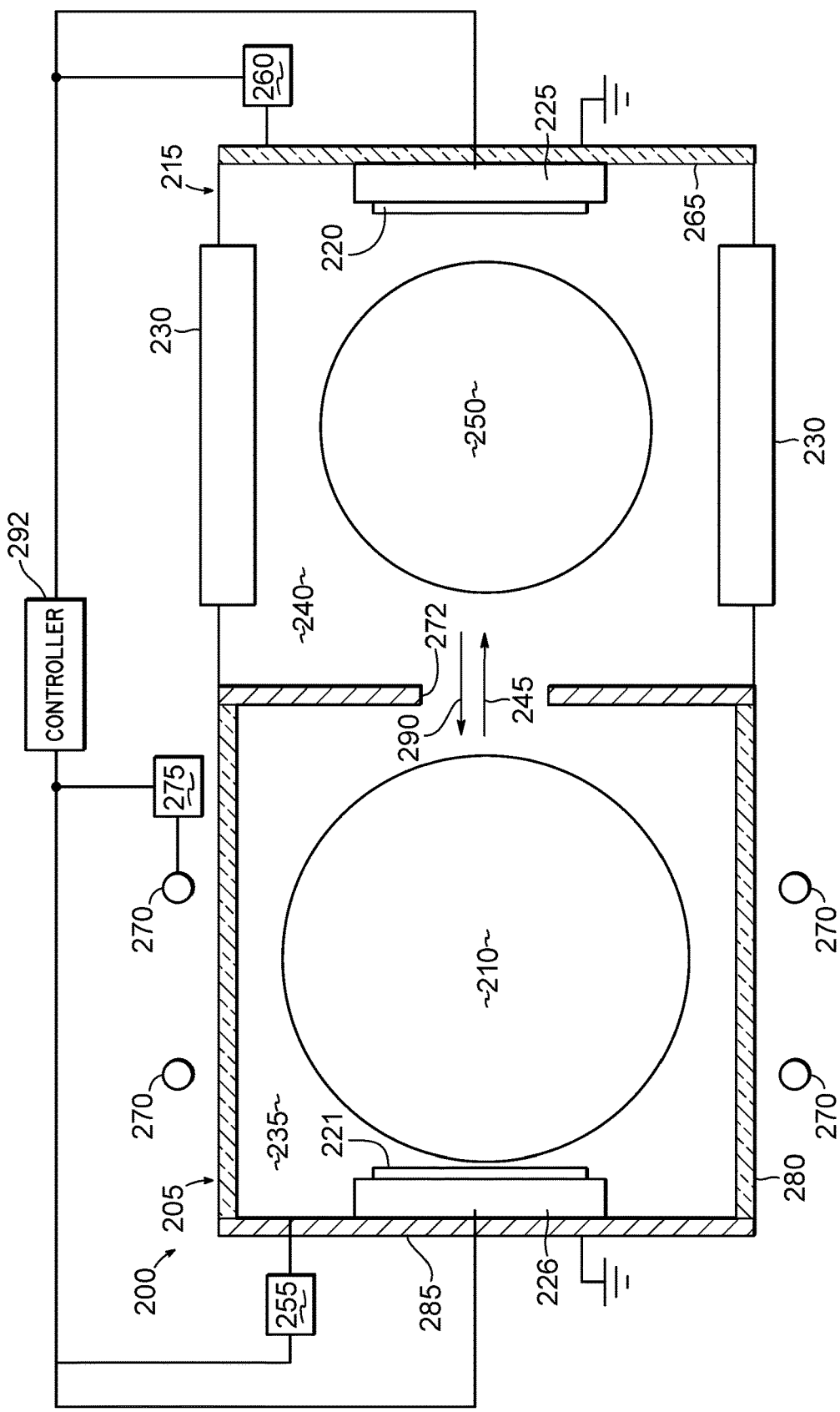
FIG. 2 is a schematic cross-sectional illustration of an exemplary processing system for self-sustained non-ambipolar plasma treatment of a substrate in accordance with an embodiment of the disclosure.

Referring to FIG. 2, a processing system 200 for non-ambipolar plasma treatment of a substrate is shown. The processing system 200 generates an electron beam 245 and an ion beam 290 to improve the power efficiency of the processing system 200. For example, as shown in FIG. 2, the electron beam 245 and the ion beam 290 simultaneously pass through a dielectric injector 272 in opposite directions forming a self-sustained processing system 200.

An electron beam source chamber 205 includes an electron beam source plasma region 235 that receives a first process gas at a first pressure to form the electron beam source plasma 210 at an electron beam source plasma potential ($V_p$, 1). An ion beam source chamber 215 includes an electron beam excited plasma region 240 disposed downstream of the electron beam source plasma region 235 to receive the electron beam 245 to form an electron beam excited plasma 250 at an electron beam excited plasma potential ($V_p$, 2) and a second pressure.

A first gas injection system 255 is coupled to the electron beam source chamber 205 to introduce the first process gas to the electron beam source plasma region 235. The first process gas may include an electropositive gas, an electronegative gas, or a mixture thereof. For example, the first process gas may include a noble gas such as argon (Ar) that may be maintained at a pressure ranging from 5 mTorr to 15 mTorr. The first process gas may include any gas maintained at any pressure that is suitable for treating the substrate 220 that will be apparent to those skilled in the relevant art(s) without departing from the scope of the present disclosure. Further, the first process gas may include other chemical constituents such as etchants, film forming gases, dilutants, cleaning gases and/or any other chemical constituent suitable for treating the substrate 220 that will be apparent to those skilled in the relevant art(s) without departing from the scope of the present disclosure.

The first process gas may create the electron beam source plasma 210. The electron beam source plasma 210 may be a capacitively coupled plasma (CCP), an inductively coupled plasma (ICP), a transformer coupled plasma (TCP), a surface wave plasma, a helicon wave plasma, an electron cyclotron resonant (ECR) heated plasma, and/or any other type of plasma that will be apparent to those skilled in the relevant art(s) without departing from the scope of the present disclosure. The electron beam source plasma 210 may be heated to produce a minimum fluctuation in the electron beam plasma potential ($V_p$, 1).

The electron beam source chamber 205 may be coupled to an inductive coil 270 that may be coupled to a power source 275. The power source 275 may include a RF generator that couples RF power through an impedance match network (not shown) to the inductive coil 270. RF power of 200 W to 400 W with a frequency range from 10 MHz to 100 MHz may be inductively coupled from the inductive coil 270 through a dielectric tube 280 to the electron beam source plasma 210 in the electron beam source plasma region 235. The dielectric tube 280 is situated along the sidewalls of the electron beam source chamber 205 and acts as an input port into the electron beam source chamber 205. The dielectric tube 280 may be mated with the inductive coil 270 to provide a hermetic seal for the electron beam source chamber 205 and a portal for transmission of the RF power into the electron beam source chamber 205. The electron beam source chamber 205 may have a large surface that may be coupled to DC ground. A slotted Faraday shield (not shown) may be employed to reduce capacitive coupling between the inductive coil 270 and the electron beam source plasma 210.

The impedance match network may improve the transfer of the RF power to plasma by reducing the reflected power. Match network topologies include but are not limited to L-type, N-type, T-type and/or any other match network topology that will be apparent to those skilled in the relevant art(s) without departing from the scope of the present disclosure. In an electropositive discharge of the electron beam source plasma 210, the electron density may range from approximately $10^{10}$ cm$^3$ to $10^{13}$ cm$^3$, and the electron temperature may range from 1 eV to about 10 eV depending on the type of plasma source that is used.

Additionally, the electron beam source chamber 205 includes a DC conductive electrode 285. The DC conductive electrode 285 includes a conductive surface that acts as a boundary that is in contact with the electron beam source plasma 210. The DC conductive electrode 285 may be coupled to DC ground. The DC conductive electrode 285 may include a doped silicon electrode. The DC conductive electrode 285 may act as an ion sink that is driven by the electron beam source plasma 210 at the electron beam source plasma potential ($V_p$, 1).

A second gas injection system 260 is coupled to the ion beam source chamber 215 to introduce a second process gas to the electron beam excited plasma region 240. The second process gas may include an electropositive gas, an electronegative gas, or a mixture thereof. For example, the second process gas may include a gas such as nitrogen gas ($N_2$) that may be maintained at a pressure ranging 1 mTorr to 3 mTorr. The second process gas may include any gas maintained at any pressure that is suitable for treating the substrate 220 that will be apparent to those skilled in the relevant art(s) without departing from the scope of the present disclosure. Further, the second process gas may include chemical constituents such as etchants, film forming gases, dilutants, cleaning gases, and/or any other chemical constituent suitable for treating the substrate 220 that will be apparent to those skilled in the relevant art(s) without departing from the scope of the present disclosure.

A substrate holder 225, on which substrate 220 resides, may be coupled to a dielectric end-plate 265 that has a floating potential relative to ground so that the substrate 220 may be at a floating ground. As a result, the only ground that the electron beam excited plasma 250 is in contact with is the floating ground provided by the substrate 220. The substrate 220 may be clamped to the substrate holder 225 via a ceramic electrostatic clamp (ESC) layer. The ESC layer may insulate the substrate 220 from the grounded substrate holder 225. The processing system 200 may also include a substrate bias system (not shown) coupled to the substrate holder 225 to electrically bias the substrate 220. For example, the substrate holder 225 may include an electrode (not shown) that is coupled to a RF generator (not shown) through an impedance match network (not shown). A frequency for the power applied to the substrate holder 225 may range from 0.1 MHz to 100 MHz.

The substrate holder 225 may also include a clamping system (not shown) to improve thermal transfer between the substrate 220 and the substrate holder 225. The clamping system may include a mechanical clamping system or an electrical clamping system such as an ESC system. The clamping system may affix the substrate 220 to an upper surface of the substrate holder 225. The substrate holder 225 may further include a substrate backside gas delivery system (not shown) to introduce gas to the back-side of the substrate 220 and the substrate holder 225. The substrate backside gas delivery system may include a two-zone gas distribution system so that a helium pressure gap may be independently varied between the center and the edge of the substrate 220.

The processing system 200 may include a substrate temperature control system (not shown) coupled to the substrate holder 225 to adjust the temperature of the substrate 220. The substrate temperature control system includes temperature control elements. The temperature control elements may include a cooling system to re-circulate coolant flow after receiving heat from the substrate holder 225 and transfer the heat to a heat exchanger system. The temperature control elements may also transfer heat from the heat exchanger system when heating the substrate holder 225. The temperature control elements may include but are not limited to resistive heating elements, thermo-electric heaters/coolers and/or any other type of temperature control elements to control the temperature of the substrate holder 225 that will be apparent to those skilled in the relevant art(s) without departing from the scope of the present disclosure.

The processing system 200 also includes a controller 292. The controller 292 includes a microprocessor, memory, and a digital input/output port capable of generating control signals sufficient to communicate and activate inputs to the processing system 200 as well as monitor outputs from the processing system 200. The controller 292 may be coupled to the first gas injection system 255, the power source 275, the second gas injection system 260, a substrate holder 226 and the substrate holder 225. In an embodiment, a program stored in the memory may activate the inputs of the above components of the processing system 200 based on a process recipe to treat the substrate 220.

The electron beam source plasma 210 may then be excited to form the electron beam 245 based on the RF power provided to the source plasma from the inductive coil 270. Argon (Ar) gas may be introduced into the electron beam source chamber 205 by first gas injection system 255. The electron beam source plasma 210 may include an equal number of negatively charged electrons and positively charged ions. RF power generated by the power source 275 may be inductively coupled to the electron beam source chamber 205 from the inductive coil to ignite the Argon (Ar) gas where a portion of the negatively charged electrons included in the electron beam source plasma 210 that have sufficiently high-energy levels are excited. The excited high-energy electrons and an equal number of low-energy ions already present in the electron beam source plasma 210 form the electron beam 245. For example, the electron beam 245 may be generated from RF power at 400 W at a frequency of 13.56 MHz, a pressure of 10 mTorr, and a temperature of 25 degrees Celsius. The electron beam 245 then travels from the electron beam source plasma region 235 to the electron beam excited plasma region 240 based on the potential difference between the electron beam source plasma potential ($V_p$, 1) and the electron beam excited plasma potential ($V_p$, 2).

As the electron beam 245 moves from the electron beam source plasma region 235 to the electron beam excited plasma region 240, the electron beam 245 passes through the dielectric injector 272. The dielectric injector 272 injects the high-energy electrons into the electron beam 245 thus creating a non-ambipolar electron beam. The injection of the high-energy electrons into the electron beam 245 improves the ionization efficiency of the electron beam excited plasma 250 as the electron beam 245 travels into the electron beam excited plasma region 240.

In an embodiment, the dielectric injector 272 separates the electron beam source plasma 210 from the electron beam excited plasma 250. The dielectric injector 272 may include a single opening with a diameter that may range from 10 µm to 10 cm. As noted above, the electron beam source plasma includes an equal number of negatively charged electrons and positively charged ions. The dielectric injector 272 limits the electrons included in the electron beam source plasma 210 that become part of the electron beam 245 with sufficient energy (e.g., high-energy electrons) to move through the single opening of the dielectric injector 272 to enter the electron beam excited plasma 250 as the electron beam 245.

When the electron beam 245 moves through the dielectric injector 272 and enters the ion beam source chamber 215, the electron beam 245 may then be accelerated via a large surface-area positive DC accelerator 230. The accelerator 230 may apply positive DC voltage (+$V_{DC}$) to the ion beam source chamber 215 to propel the low-energy ions that are similar to the ions included in ion current $j_{i1}$ as discussed in FIG. 1 so that the low-energy ions travel through the electron beam excited plasma region 240 and reach the substrate 220. The high-energy electrons that are similar to the electrons included in electron current $j_{e1}$ as discussed in FIG. 1 guide the low-energy ions to control the IED of the low-energy ions while maintaining the positive charge of the low-energy ions as the low-energy ions treat the substrate 220. The positive DC voltage (+$V_{DC}$) applied by the accelerator 230 to accelerate the low-energy ions may range from 1V to 100 kV. The accelerator may apply DC voltage that is continuous and/or pulsed.

The accelerator 230 may be coupled to an inside portion of the ion beam source chamber 215 and have a diameter similar to the ion beam source chamber 215. The accelerator 230 may occupy a large surface area of the ion beam source chamber 215 so that the accelerator 230 may adequately accelerate the positively charged ions throughout the ion beam source chamber 215. A remaining surface area of the ion beam source chamber 215 may include the dielectric end-plate 265 that surrounds the substrate 220. The dielectric end-plate 265 may be a floating surface, such as quartz for example, that may float relative to the positive DC voltage (+$V_{DC}$) provided by the accelerator 230.

The significant amount of DC voltage (+$V_{DC}$) applied by the accelerator 230 may generate a significant voltage potential gradient separating the electron beam source plasma 210 and the electron beam excited plasma 250 where the electron beam source plasma potential ($V_p$, 1) is significantly less than the electron beam excited plasma potential ($V_p$, 2). The significant voltage potential gradient may generate a double layer between the electron beam source chamber 205 and the ion beam source chamber 215. A double layer is a structure in plasma that includes two parallel layers with opposite electrical charge. The layers of opposite charge cause a strong electric field that corresponds to the sharp change in voltage caused by the significant voltage potential gradient. Positively charged high-energy ions and negatively charged high-energy electrons that enter the double layer simultaneously may be accelerated by the electric field in opposite directions. As a result, an ion beam 290 may be formed in the ion beam source chamber 215 and then propelled through the dielectric injector 272 into the electron beam source chamber 205.

The electron beam excited plasma 250 may be excited to serve as the source of the ion beam 290 based on the DC voltage applied to the electron beam excited plasma 250 from the accelerator 230. Nitrogen gas ($N_2$) may be introduced into the ion beam source chamber 215 by the second gas injection system 260. DC power may ignite the nitrogen gas ($N_2$) forming the ion beam 290 in the electron beam excited plasma 250. The electron beam excited plasma 250 may include an equal number of negatively charged electrons and positively charged ions. The negatively charged electrons may include the high-energy electrons included in the electron beam 245 along with low-energy electrons that are not associated with the electron beam 245. The positively charged ions may include the low-energy ions along with ions with the potential to be excited into high-energy ions that are not associated with the electron beam 245.

The DC voltage applied by the accelerator 230 to the ion beam source chamber 215 may excite the ions. The excited ions in the electron beam excited plasma 250 form the ion beam 290. For example, the ion beam 290 may be generated from a DC voltage of 600V at a pressure of 2 mTorr and a temperature of 25 degrees Celsius. The ion beam 290 then travels from the electron beam excited plasma region 240 to the electron beam source plasma region 235 based on the potential difference between the electron beam source plasma potential ($V_p$, 1) and the electron beam excited plasma potential ($V_p$, 2). As the ion beam 290 moves from the electron beam excited plasma region 240 to the electron beam source plasma region 235, the ion beam 290 passes through the dielectric injector 272. The dielectric injector 272 injects the high-energy ion beam 290 thus creating a non-ambipolar ion beam that enters the electron beam source plasma 210.

After the simultaneous injection of the electron beam 245 and the ion beam 290 has been established and stabilized, the simultaneous injection of the electron beam 245 into the ion beam source chamber and the ion beam 290 into the electron beam source chamber 205 may generate a self-sustained non-ambipolar DC system. The injection of the ion beam 290 may generate an energy field, such as an electric field, with sufficient strength to maintain the intensity of the electron beam 245 as the electron beam excited plasma 250 treats the substrate 220 for the duration of the processing of the substrate 220. As a result, the RF power applied to the electron beam source chamber 205 that may range from 200

W to 400 W or any power range that was previously required to maintain the intensity of the electron beam 245 as the electron beam excited plasma 250 treats the substrate 220 may be terminated. The energy field generated by the ion beam 290 that is travelling simultaneously in the opposite direction of the electron beam 245 may be of sufficient strength to replace the RF power that was previously required to maintain the structure of electron beam 245. Thus, the system power level of the processing system 200 may be decreased resulting in a significant increase in power efficiency of the processing system 200 that may be attained.

For example, the power source 275 provides 400 W of RF power to the inductive coil 270 at an RF frequency of 13.56 MHz at a pressure of 10 mT to ignite the electron beam source plasma 210 to generate the electron beam 245. The electron beam 245 is injected from the electron beam source chamber 205 through the dielectric injector 272 into the ion beam source chamber 215 to generate the electron beam excited plasma 250 to treat the substrate 220. The accelerator 230 applies a DC voltage of 600V to the ion beam source chamber 215 at a pressure of 2 mT that creates a significant potential gradient with a double layer. The significant potential gradient simultaneously accelerates the electron beam 245 into the ion beam source chamber 215 towards the substrate 220 and the ion beam 290 into the electron beam source chamber 205.

The simultaneous injection of the ion beam 290 in the opposite direction of the electron beam 245 creates an energy field that is sufficient to maintain the intensity of the electron beam 245 as the electron beam excited plasma 250 treats the substrate 220 creating a self-sustained processing system 200. As a result, the 400 W of RF power supplied by the power source 275 to the electron beam source chamber 205 is terminated. The accelerator 230 maintains the DC voltage of 600V that is applied to the ion beam source chamber 215 at a current of 10 mA. Thus, the system power level of the processing system 200 required to maintain the electron beam 245 at a current density of 0.57 $Acm^{-2}$ is 6 W, which is a significant decrease from the 400 W of RF power originally generated by the power source 275.

In an embodiment, the current density of the electron beam 245 may be adjusted by adjusting the DC voltage applied by the accelerator 230 to the ion beam source chamber 215. The current density of the electron beam 245 may have an impact on the processing of the substrate 220. Based on the processing specifications of the substrate 220, the substrate may require a specific level of current density included in the electron beam 245 to adequately process the substrate 220 in a specified period of time. A minimum level of current density for the electron beam 245 may correspond to the minimum level of DC voltage applied by the accelerator 230 to maintain the electron beam 245 at the minimum level of current density. The system power level of the processing system 200 represented by the minimum level of DC voltage applied by the accelerator 230 corresponds to a maximum power efficiency attained by the processing system 200 based on the minimum amount of power used by the processing system 200.

The current density of the electron beam 245 may be increased with a slight increase in the DC voltage applied to the accelerator 230 which results in a slight decrease in the power efficiency attained by the processing system 200 based on the slight increase of power used by the processing system 200 generated from slight increase in DC voltage. However, the slight increase in the system power level for the processing system 200 that results from the slight increase in DC voltage by the accelerator 230 to increase the current density of the electron beam 245 may be significantly less than the RF power generated by the power source 275 to conventionally maintain the current density of the electron beam 245. Thus, the DC voltage applied by the accelerator 230 may be adjusted accordingly to adjust the current density of the electron beam 245 to satisfy the processing specifications of the substrate 220 while attaining improved power efficiency as compared to conventional methods.

For example, the accelerator 230 applies a DC voltage of 600V to the ion beam source chamber 215 during the simultaneous injection of the ion beam 290 and the electron beam 245 to maintain the electron beam 245 at a current density of 0.57 $Acm^{-2}$ that results in 6 W of total power supplied by the accelerator 230. The accelerator 230 increases the DC voltage that is applied to the ion beam source chamber 215 from 600V to 700V to increase the current density of the electron beam from 0.57 $Acm^{-2}$ to 1.44 $Acm^{-2}$ where the total power supplied by the accelerator 230 increases from 6 W to 17.8 W.

The increase in the power system power level for the processing system 200 that results from the increase in DC voltage by the accelerator to increase the current density of the electron beam 245 may still be significantly less than the RF power generated by the power source 275 to conventionally maintain the current density of the electron beam 245. For example, the RF power typically generated to maintain the current density of the electron beam based on conventional methods ranges from 200 W to 10 kW. An increase in the power generated by the accelerator 230 from 6 W to 17.8 W to increase the current density of the electron beam 245 from 0.57 $Acm^{-2}$ to 1.44 $Acm^{-2}$ is significantly less than the RF power generated in conventional methods.

In an embodiment, the current density of the electron beam 245 may also be adjusted by adjusting the quantity of dielectric injectors 272. The current density of the electron beam 245 may be increased with an increase in the quantity of dielectric injectors 272 that are positioned between the electron beam source chamber 205 and the ion beam source chamber 215.

For example, the accelerator 230 applies a DC voltage of 700V to the ion beam source chamber 215 during the simultaneous injection of the ion beam 290 and the electron beam 245 through a dielectric injector 272 to maintain the electron beam 245 at a current density of 1.44 $Acm^{-2}$ that results in 17.8 W of total power supplied by the accelerator 230. If the quantity of dielectric injectors 272 is increased from a single dielectric injector 272 to seven dielectric injectors 272 with six dielectric injectors 272 positioned in a circle and a seventh dielectric injector 272 positioned in the center of the circle and the accelerator 230 decreases the DC voltage applied to the ion beam source chamber 215 to 600V, then the current density of the electron beam increases from 1.44 $Acm^{-2}$ to 1.78 $Acm^{-2}$ where the total power supplied by the accelerator 230 increases from 17.8 W to 130 W.

The increase in the system power level for the processing system 200 that results from the increase in dielectric injectors 272 to increase the current density of the electron beam 245 may still be significantly less than the RF power generated by the power source 275 to conventionally maintain the current density of the electron beam 245. For example, the RF power typically generated to maintain the current density of the electron beam based on conventional methods ranges from 200 W to 10 kW. An increase in the power generated by the accelerator 230 from 17.8 W to 130 W to increase the current density of the electron beam 245 from 1.44 Acm$^{-2}$ to 1.78 Acm$^{-2}$ is significantly less than the RF power generated in conventional methods. Any quantity of dielectric injectors may be positioned in any manner to attain a specific current density of the electron beam 245 at a specific system power level generated by the accelerator 230 to adequately treat the substrate 220 that will be apparent to those skilled in the relevant art(s) without departing from the scope of the present disclosure.

In an embodiment, a substrate 221 may be positioned on the substrate holder 226 in the electron beam source chamber 205. The injection of the ion beam 290 into the electron beam source chamber 205 may result in the electron beam source plasma 210 treating the substrate 221 in a similar manner as the electron beam excited plasma 250 treats the substrate 220 due to the injection of the electron beam 245 into the electron beam excited plasma 250. The substrate 221 may be treated in place of the substrate 220 in that the substrate 220 is removed from the ion beam source chamber 215 so that only the substrate 221 housed in the electron beam source chamber 205 is treated. However, the substrate 221 may be housed in the electron beam source chamber 205 simultaneously with the substrate 220 housed in the ion beam source chamber 215 so that the substrate 221 is treated by the electron beam source plasma 210 simultaneously with the substrate 220 treated by the electron beam excited plasma 250.

Figure 3:
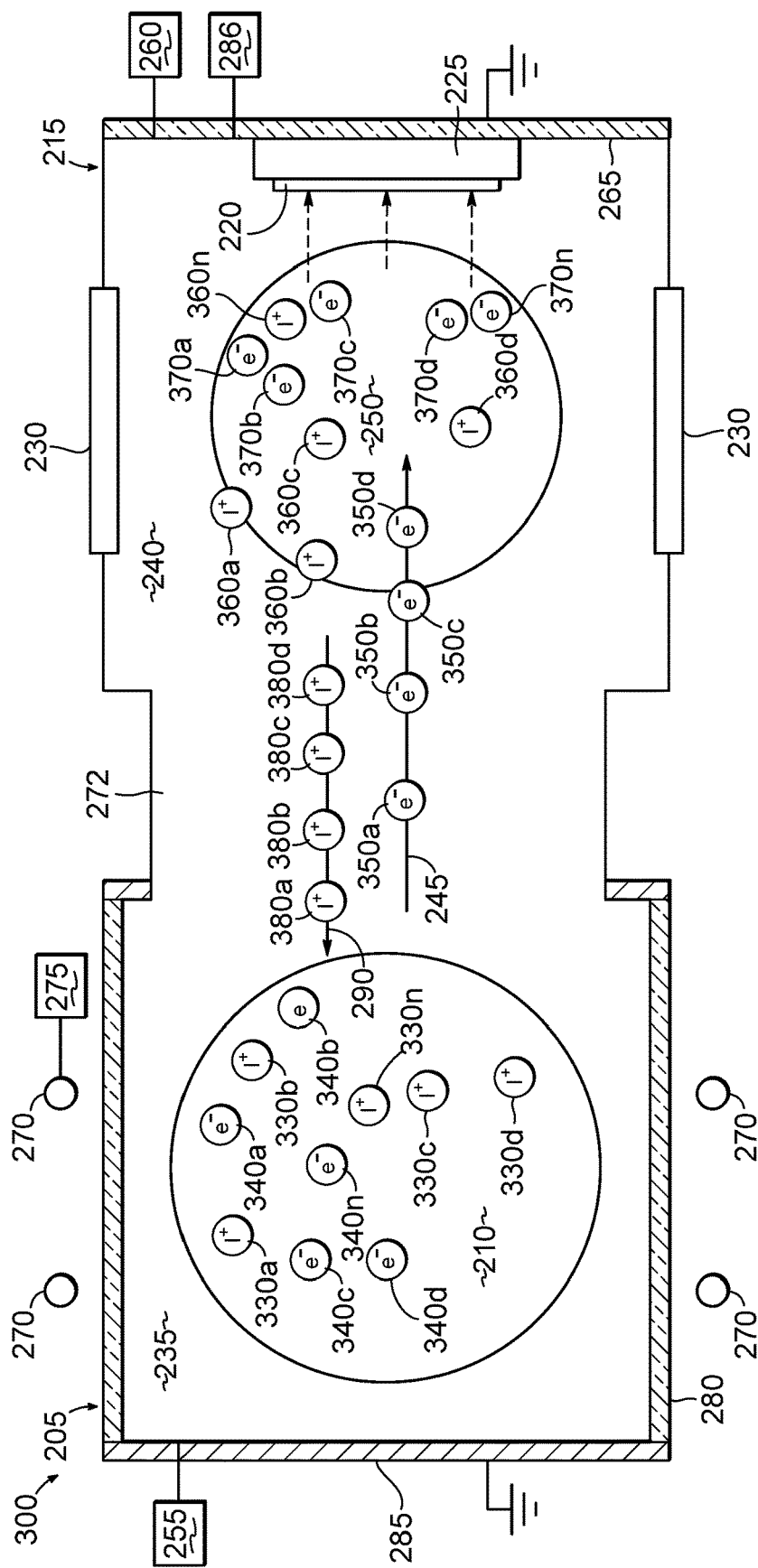
FIG. 3 is a schematic cross-sectional illustration of an exemplary processing system for self-sustained non-ambipolar plasma treatment of a substrate in accordance with an embodiment of the disclosure.

Referring to FIG. 3, in which like reference numerals are used to refer to like parts, a processing system 300 for non-ambipolar plasma treatment of a substrate is shown. The processing system 300 shares many similar features with the processing system 200; therefore, only the differences between the processing system 300 and the processing system 200 are to be discussed in further detail. The following discussion of FIG. 3 goes into further detail regarding the simultaneous generation of the electron beam 245 and the ion beam 290 in opposite directions so that the RF power supplied by the power source 275 to the electron beam source chamber 205 can be terminated while maintaining the intensity of the electron beam 245 to generate the electron beam excited plasma 250 to process the substrate 220. For example, as shown in FIG. 3, the Maxwellian-tail electrons 350(a-d) have sufficient energy to be injected through the dielectric injector 272 into the ion beam source chamber 215 while simultaneously the high-energy ions 380(a-d) have sufficient energy to be injected through the dielectric injector 272 into the electron beam source chamber 205. While four electrons and ions (a-d) are depicted, it may be appreciated that any number (integer greater than 1) of electrons 350 and ions 380 may be simultaneously injected in opposite directions.

As noted above, the electron beam source plasma 210 may be excited to form the electron beam 245 based on the RF power provided to the electron beam source plasma 210 from the inductive coil 270. The electron beam source plasma 210 may include electrons 340(a-n) where n is an integer equal to or greater than one. The RF power provided to the source plasma excites the electrons 340(a-n) so that a portion of the electrons 340(a-d) obtain an energy level sufficient to become Maxwellian-tail electrons 350(a-d) (electrons with high-energy levels) that are propelled through the dielectric injector 272 forming electron beam 245. The electron beam source plasma 210 may also include ions 330(a-n) that are equivalent to the quantity of electrons 340(a-n) also included in the electron beam source plasma 210.

The Maxwellian-tail electrons 350(a-d) that form the non-ambipolar electron beam 245 that enters the ion beam source chamber 215. The Maxwellian-tail electrons 350(a-d) in electron beam 245a improve the ionization efficiency of the electron beam excited plasma 250 as the electron beam 245 travels through the electron beam excited plasma region 240 and ignites the electron beam excited plasma 250.

The power of the injected electron beam 245 may be damped by the electron beam excited plasma 250 based on complicated instabilities between the electron beam 245 and the electron beam excited plasma 250 rather than conventional electron-neutral collisions. Langmuir waves included in the electron beam excited plasma 250 may be excited by the electron beam 245 where the phase velocity of the Langmuir waves is similar to the phase velocity of the electron beam 245. The primary Langmuir wave eventually decay into ion waves and secondary Langmuir waves with phase velocities in the range of the energetic Maxwellian-tail electron population. The Langmuir waves with phase velocities similar to the speed of the Maxwellian-tail electrons 350(a-d) included in the electron beam excited plasma 250 may transfer their energy to the Maxwellian-tail electrons 350(a-d) included in the electron beam excited plasma 250 via Landau damping. The transfer of energy from the Langmuir waves to the Maxwellian-tail electrons 350(a-d) included in the electron beam excited plasma 250 may generate a broad energy spectrum for the electrons 370(a-n) maintaining the electron beam excited plasma 250.

As noted above, the electron beam excited plasma 250 may be excited to form the ion beam 290 based on the DC voltage provided to the electron beam excited plasma 250 from the accelerator 230. The DC voltage generated by the accelerator 230 may generate a significant potential gradient between the electron beam excited plasma region 240 and the electron beam source plasma region 235 where the voltage potential ($V_p$, 2) of the electron beam excited plasma region 240 is equal to the DC voltage ($V_{DC}$) that is generated by the accelerator 230. The electron beam excited plasma 250 may include ions 360(a-n), where n is an integer equal to or greater than one, and also electrons 370(a-n), where n is an integer equal to or greater than one. The quantity of ions 360(a-n) may be equivalent to the quantity of electrons 370(a-n). The significant potential gradient forms a double layer so that a portion of the ions 360(a-n) obtain an energy level sufficient to become high-energy ions 380(a-d) (ions with high-energy levels) and propel through the dielectric injector 272 forming ion beam 290.

The high-energy ions 380(a-d) that form the non-ambipolar beam 290 that enter the electron beam source chamber 205. The high-energy ions 380(a-d) in ion beam 290 generate an electric field that is sufficient to maintain the particle balance between the electron beam source plasma 210 and the electron beam excited plasma 250 while the electron beam excited plasma 250 treats the substrate 220 creating a self-sustaining processing system 300. Thus, the RF power may be terminated increasing the power efficiency of the processing system 300.

After the RF power is terminated, the speed of the high-energy ions 380(a-d) may be significant. The high-energy ions 380(a-d) may be travelling at supersonic velocities which are significantly higher than ion acoustic speeds. For example, the high-energy ions 380(a-d) may be travelling at a supersonic velocity of $10^2$ km/s. The high-energy ions 380(a-d) may form ion waves that heat up the electron beam source plasma 210 through ion-acoustic instability that arises in the electron beam source plasma 210. As a result, the energy of the ion waves may be transferred to the electron beam source plasma 210 by ion-Landau damping.

The self-sustained non-ambipolar plasma processing system 300 may be used in a variety of potential applications in nanofabrication and space propulsion. For example processing system 300 may be used in reactive ion etching processes for the substrate 220. In another example, the substrate 220 housed in the ion beam source chamber 215 may be replaced with a neutralizer grid that couples the ion beam source chamber 215 to a third chamber (not shown) that houses the substrate 220. In another example, the processing system 300 may be used for plasma enhanced deposition.

The processing system 300 may also be applied as a space-charge neutral plasma beam thruster. The electron beam source plasma 210 may have a low electron beam source plasma potential ($V_p$, 1). Therefore, the electron beam source plasma 210 may serve as the exhaust cone and the conduit to space. The injected ion beam 290 from the electron beam excited plasma 250 may be space-charge neutralized by both the thermal electrons included in the electron beam source plasma 210 and the charge exchange process within the electron beam source plasma 210. Then, the momentum carried by the ion beam 290 continues propagating to the end of the electron beam source chamber 205 in the form of a space-charge neutral energetic plasma beam as the exhaust of the thruster.

The processing system 300 may be implemented without electrodes thus lowering the cost of the processing system 300. The processing system 300 may not require an external neutralizer, thereby generating longer continuous-thrust missions. The processing system 300 may be easily scaled up by adding additional DC power and/or increasing the number of openings in the dielectric injector 272 so that the applications of the processing system 300 may range from miniature thrusters to large-scale plasma rockets.

Figure 4:
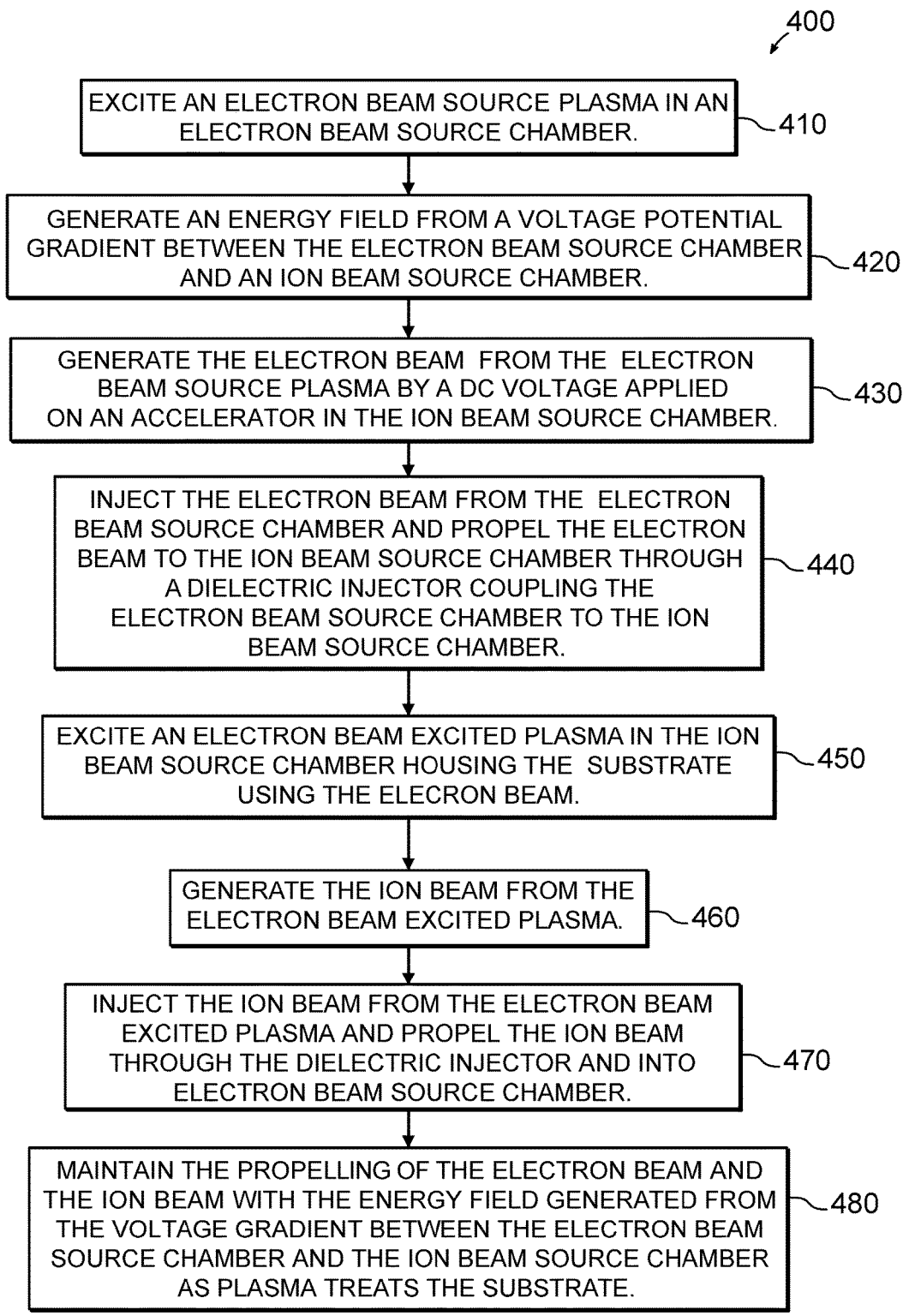
FIG. 4 is a flowchart of exemplary operational steps of a processing system according to an exemplary embodiment of the present disclosure.

FIG. 4 is a flowchart of exemplary operational steps of a processing system according to an exemplary embodiment of the present disclosure. The present disclosure is not limited to this operational description. Rather, it will be apparent to persons skilled in the relevant art(s) from the teaching herein that other operational control flows are within the scope of the present disclosure. The following discussion describes the steps in FIG. 4.

At step 410, electron beam source plasma 210 is excited in an electron beam source chamber.

At step 420, an energy field is generated from a voltage potential gradient applied between the electron beam source chamber and the ion beam source chamber.

At step 430, an electron beam is generated from the excited electron beam source plasma by the DC voltage applied on an accelerator in the ion beam source chamber. For example, a power source 275 couples radio frequency (RF) power onto an inductive coil 270 to provide power to an electron beam source chamber 205. The RF power excites electron beam source plasma 210 to generate an electron beam 245 to ignite electron beam excited plasma 250 that treats a substrate 220.

At step 440, the electron beam is injected from the electron beam plasma and propelled to the ion beam source chamber through a dielectric injector coupling the electron beam source chamber to the ion beam source chamber. Specifically, the electron beam 245 is injected from the electron beam source plasma 210 and propelled to the ion beam source chamber 215 through a dielectric injector 272 coupling the electron beam source chamber 205 to the ion beam source chamber 215.

At step 450, electron beam excited plasma is excited in an ion beam source chamber housing the substrate using the electron beam.

At step 460, the ion beam is generated from the electron beam excited plasma. For example, a large surface-area positive DC accelerator 230 provides direct current (DC) voltage to an ion beam source chamber 215. The DC voltage excites the electron beam excited plasma 250 to generate an ion beam 290.

At step 470, the ion beam is injected from the electron beam excited plasma and propelled through the dielectric injector and into the electron beam source chamber. Specifically, the ion beam 290 is injected from the electron beam excited plasma 250 and propelled through the dielectric injector 272 and into the electron beam source chamber 205.

At step 480, the propelling of the electron beam and the ion beam is maintained with the energy field generated from the voltage potential gradient applied between the electron beam source chamber and the ion beam source chamber as the plasma treats the substrate. Specifically, the propelling of the electron beam 245 and the ion beam 290 is maintained with the energy field generated from the voltage potential gradient applied between the electron beam source chamber 205 and the ion beam source chamber 215 generated by accelerator 230 as one or both of the electron beam excited plasma 250 and the electron beam source plasma 210 treats the substrate 220. The energy field generated from the voltage potential gradient applied between the electron beam source chamber 205 and the ion beam source chamber 215 generated by the accelerator 230 is sufficient to maintain the propelling of the electron beam 245 and the ion beam 290 so that the RF power provided by the power source 275 can be terminated improving the power efficiency of the processing system 200.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A method for processing a substrate comprising:
   exciting an electron beam source plasma in an electron beam source chamber and generating an electron beam from the electron beam source plasma;
   injecting the electron beam from the electron beam source plasma and propelling the electron beam into an ion beam source chamber through a dielectric injector that couples the electron beam source chamber with the ion beam source chamber;
   exciting an electron beam excited plasma in the ion beam source chamber with the injected electron beam and generating an ion beam from the electron beam excited plasma;
   injecting the ion beam from the electron beam excited plasma and propelling the ion beam through the dielectric injector and into the electron beam source chamber;
   applying power to the electron beam source chamber and propelling the electron beam into the ion beam source chamber wherein the electron beam excited plasma includes generally an equal number of electrons and ions in the ion beam source chamber;

applying power to the ion beam source chamber and propelling the ion beam into the electron beam source chamber wherein the electron beam source plasma includes generally an equal number of electrons and ions in the electron beam source chamber;

providing a substrate in one or both of the electron beam source chamber and the ion beam source chamber and treating the substrate with one or both of the electron beam source plasma and electron beam excited plasma;

maintaining the propelling of simultaneously generated ion beam and electron beam in opposite directions for generating an energy field sufficient for maintaining the electron beam;

decreasing the power to the electron beam source chamber when the energy field is sufficient for maintaining the electron beam.

2. The method of claim 1, further comprising:
housing a first substrate in the electron beam source chamber; and
treating the first substrate with the electron beam source plasma;
housing a second substrate in the ion beam source chamber;
treating the second substrate with the electron beam excited plasma.

3. The method of claim 1, further comprising:
applying radio frequency (RF) power to the electron beam source chamber to excite the electron beam source plasma to generate and propel the electron beam until an energy field is generated by a voltage potential gradient between the electron beam source chamber and the ion beam source chamber; and
terminating the RF power when the energy field generated by the voltage potential gradient between the electron beam source chamber and the ion beam source chamber maintains the propelling of the electron beam and the ion beam.

4. The method of claim 3, further comprising:
applying a direct current (DC) voltage to the ion beam source chamber to generate a voltage potential gradient between the electron beam source chamber and the ion beam source chamber, wherein the voltage potential gradient propels the ion beam from the ion beam source chamber into the electron beam source chamber and the electron beam from the electron beam source chamber into the ion beam source chamber so that the ion beam and the electron beam are propelled through the dielectric injector simultaneously in opposite directions to generate the energy field that maintains the electron beam.

5. The method of claim 4, wherein a first voltage potential associated with the electron beam source chamber is less than a second voltage potential associated with the ion beam source chamber.

6. The method of claim 5, wherein the second voltage potential associated with the ion beam source chamber is equivalent to the DC voltage applied to the ion beam source chamber.

7. The method of claim 4, wherein a system power level of the processing system is equivalent to a DC power level that is based on the DC voltage applied to the ion beam source chamber when the RF power is terminated.

8. The method of claim 7, wherein the system power level is at a minimum when the RF power is terminated and the DC power level is applied to the ion beam source chamber so the electron beam is maintained.

9. The method of claim 8, wherein the system power level is at the minimum when the RF power is terminated and the DC power level is 6 Watts so that the electron beam is maintained.

10. The method of claim 4, further comprising:
increasing a current density of the electron beam when the DC voltage is increased and the RF power is terminated.

11. The method of claim 10, further comprising:
adjusting the DC voltage to balance a desired system power level of the processing system with a desired current density of the electron beam when the RF power is terminated.

12. The method of claim 1, further comprising applying power to the electron beam source chamber to a level sufficient when propelling the electron beam to the ion beam source chamber to limit injected electrons in the electron beam to electrons having sufficient energy to propagate through the dielectric injector.

13. A method for processing a substrate comprising:
exciting an electron beam source plasma in an electron beam source chamber and generating an electron beam from the electron beam source plasma;
injecting the electron beam from the electron beam source plasma and propelling the electron beam into an ion beam source chamber through a dielectric injector that couples the electron beam source chamber with the ion beam source chamber;
exciting an electron beam excited plasma in the ion beam source chamber with the injected electron beam and generating an ion beam from the electron beam excited plasma;
injecting the ion beam from the electron beam excited plasma and propelling the ion beam through the dielectric injector and into the electron beam source chamber;
applying power to the electron beam source chamber and the ion beam source chamber for simultaneously generating and propelling the respective electron beam and ion beam in opposite directions and into a respective ion beam source chamber and electron beam source chamber for generating an energy field sufficient for maintaining the electron beam;
providing a substrate in one or both of the electron beam source chamber and the ion beam source chamber and treating the substrate with one or both of the electron beam source plasma and electron beam excited plasma;
decreasing the power to the electron beam source chamber when the energy field is sufficient for maintaining the electron beam.

14. The method of claim 13, further comprising:
housing a first substrate in the electron beam source chamber; and
treating the first substrate with the electron beam source plasma;
housing a second substrate in the ion beam source chamber;
treating the second substrate with the electron beam excited plasma.

15. The method of claim 13, further comprising:
applying radio frequency (RF) power to the electron beam source chamber to excite the electron beam source plasma to generate and propel the electron beam for generating an energy field by a voltage potential gradient between the electron beam source chamber and the ion beam source chamber; and terminating the RF power when the energy field generated by the voltage potential gradient between the electron beam source chamber and the ion beam source chamber maintains the propelling of the electron beam and the ion beam.

16. The method of claim 15, further comprising:
applying a direct current (DC) voltage to the ion beam source chamber to generate a voltage potential gradient between the electron beam source chamber and the ion beam source chamber for propelling the ion beam from the ion beam source chamber into the electron beam source chamber and the electron beam from the electron beam source chamber into the ion beam source chamber.

17. The method of claim 13, further comprising applying power to the electron beam source chamber and the ion beam source chamber to form a first voltage potential associated with the electron beam source chamber and a second voltage potential associated with the ion beam source chamber, wherein the first voltage potential associated with the electron beam source chamber is less than a second voltage potential associated with the ion beam source chamber.

18. The method of claim 16, further comprising:
increasing a current density of the electron beam including increasing the DC voltage and terminating the RF power.

19. The method of claim 18, further comprising:
adjusting the DC voltage to balance a desired system power level of the processing system with a desired current density of the electron beam when the RF power is terminated.

20. The method of claim 13, further comprising applying power to the electron beam source chamber to a level sufficient when propelling the electron beam to the ion beam source chamber to limit injected electrons in the electron beam to electrons having sufficient energy to propagate through the dielectric injector.

* * * * *